United States Patent
Egawa (10) Patent No.: US 6,611,457 B2
(45) Date of Patent: Aug. 26, 2003

(54) READ-ONLY NONVOLATILE MEMORY

(75) Inventor: Noboru Egawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/077,957

(22) Filed: Feb. 20, 2002

(65) Prior Publication Data

US 2003/0053336 A1 Mar. 20, 2003

(30) Foreign Application Priority Data

Sep. 18, 2001 (JP) ........................................ 2001-282613

(51) Int. Cl.[7] .............................................. G11C 16/04
(52) U.S. Cl. ............................ 365/185.05; 365/185.06; 365/185.18
(58) Field of Search ..................... 365/185.05, 185.06, 365/185.17, 185.11, 185.24, 185.18

(56) References Cited

U.S. PATENT DOCUMENTS

| | | | | |
|---|---|---|---|---|
| 5,889,711 A | * | 3/1999 | Yang et al. | 365/200 |
| 5,959,877 A | * | 9/1999 | Takahashi | 365/104 |
| 6,243,293 B1 | | 6/2001 | Van Houdt et al. | 365/185.14 |
| 6,246,607 B1 | | 6/2001 | Mang et al. | 365/185.17 |
| 6,487,119 B2 | * | 11/2002 | Egawa et al. | 365/185.18 |

FOREIGN PATENT DOCUMENTS

| | | |
|---|---|---|
| JP | 53020777 | 2/1978 |
| JP | 62194662 | 8/1987 |
| JP | 02000355 | 1/1990 |
| JP | 3-1396 | 1/1991 |
| JP | 3-19372 | 1/1991 |
| JP | 05055560 | 3/1993 |
| JP | 08153806 | 6/1995 |
| JP | 08288408 | 11/1996 |
| JP | 08316341 | 11/1996 |
| JP | 04256360 | 9/2002 |

* cited by examiner

Primary Examiner—Richard Elms
Assistant Examiner—Hien Nguyen
(74) Attorney, Agent, or Firm—Volentine Francos, PLLC (57) ABSTRACT

A read-only nonvolatile memory in which the leakage current of unselected memory cell transistors is suppressed. Adjacent memory cell transistors are commonly connected to drain lines, and adjacent memory cell transistors on the other side are commonly connected to source lines. Gates within a same row are commonly connected to a word line. An offset structure is formed on the drain side of each memory cell transistor, and a non-offset structure is formed on the source side. Accordingly, in each memory cell transistor a depletion layer is generated between the drain region and channel region when a drain line is activated, but the depletion layer directly under a drain region does not reach the channel region when the drain line is in a state of high impedance. Therefore, there is no leakage current from the drain to the source in unselected memory cell transistors. Since there is no leakage current flowing from unselected memory cell transistors to source lines, the read margin is enhanced.

20 Claims, 6 Drawing Sheets

READ-ONLY NONVOLATILE MEMORY

BACKGROUND OF THE INVENTION

1. Field of the Invention

The present invention relates to a read-only nonvolatile memory such as a mask ROM (Read Only Memory).

2. Description of Related Art

A mask ROM is a known example of a read-only nonvolatile memory.

A mask ROM comprises memory cell transistors laid out in a matrix, and binary data is written to each memory cell transistor at the manufacturing stage. This binary data is written as the level of the operating threshold of each memory cell transistor. The operating threshold of a transistor can be controlled, for example, by varying the impurity concentration of a channel formation region. In the following description, the stored value will be "1" when the operating threshold is low, and will be "0" when the operating threshold is high.

In each memory cell transistor, a gate is connected to a word line, the source is connected to a source line, and the drain is connected to a drain line.

When the potential difference between a source line and a drain line is suitably set and the word line is activated, a memory cell transistor with a low operating threshold is switched on, while a memory cell transistor with a high operating threshold is not. Therefore, the level of the operating threshold, that is, the value of the written binary data, can be determined from the value of the current that flows out to the source lines.

A small amount of current may be leaked at a memory cell transistor although the transistor is off. Leakage current is more apt to occur at a transistor with a low operating threshold. Therefore, when data is being read out from a memory cell transistor with a high operating threshold, leakage current may flow from a memory cell transistor with a low operating threshold to a source line. In this case, a small amount of current will flow to the source line even though the current value corresponding to the read data is zero. This phenomenon reduces the read margin of a memory cell transistor. Leakage current flows when a potential difference is generated between the source and drain of a memory cell transistor that is off. This potential difference can be caused by an increase in the potential of another source line, or by a charge accumulated in the parasitic capacitance of another source line or drain line. The accumulated charge of parasitic capacitance can be eliminated by discharging, but this discharging lowers the substantial operating speed of a mask ROM.

When the integration is increased or the power consumption lowered for a read-only nonvolatile memory, it is necessary to lower the current value when a memory cell transistor is on. The lower the ON current is set for a memory cell transistor, the greater the effect of leakage current. Also, increasingly higher operating speeds are being required of read-only nonvolatile memories.

SUMMARY OF THE INVENTION

It is an object of the present invention to provide a read-only nonvolatile memory with a large read margin and a high operating speed.

To this end, the read-only nonvolatile memory pertaining to the present invention comprises a plurality of memory cell transistors, disposed in a matrix, and disposed such that source diffusion regions and drain diffusion regions are respectively opposing to each other within the same row, a plurality of row selection lines commonly connected to the gate electrodes of the memory cell transistors belonging to the same row, a plurality of drain lines each commonly connected to two opposing columns of the drain diffusion regions, a plurality of source lines each commonly connected to two opposing columns of the source diffusion regions, an offset structure formed between the gate electrode and said drain diffusion region of each memory cell transistor, and a non-offset structure formed between the gate electrode and said source diffusion region of each memory cell transistor.

With the constitution of the present invention, it is possible to prevent the flow of current from a memory cell transistor that has been set to OFF to a source line.

In the present invention, "offset structure" refers to a structure in which the depletion layer directly under a diffusion region extends to the channel when a specific voltage has been applied to that diffusion region, but in which the depletion layer directly under that diffusion region does not extend to the channel when the diffusion region is in a state of high impedance.

BRIEF DESCRIPTION OF THE DRAWINGS

Other objects and advantages of the present invention will now be described through reference to the appended drawings.

DESCRIPTION OF THE PREFERRED EMBODIMENTS

Embodiments of the present invention will now be described through reference to the drawings. In the drawings, the size, shape, and layout relationship of the various constituent components are merely shown schematically in order to facilitate an understanding of the present invention, and the numerical conditions given in the following description are nothing but examples.

First Embodiment

A mask ROM will be used as an example for the read-only nonvolatile memory pertaining to the first embodiment.

Figure 1A:
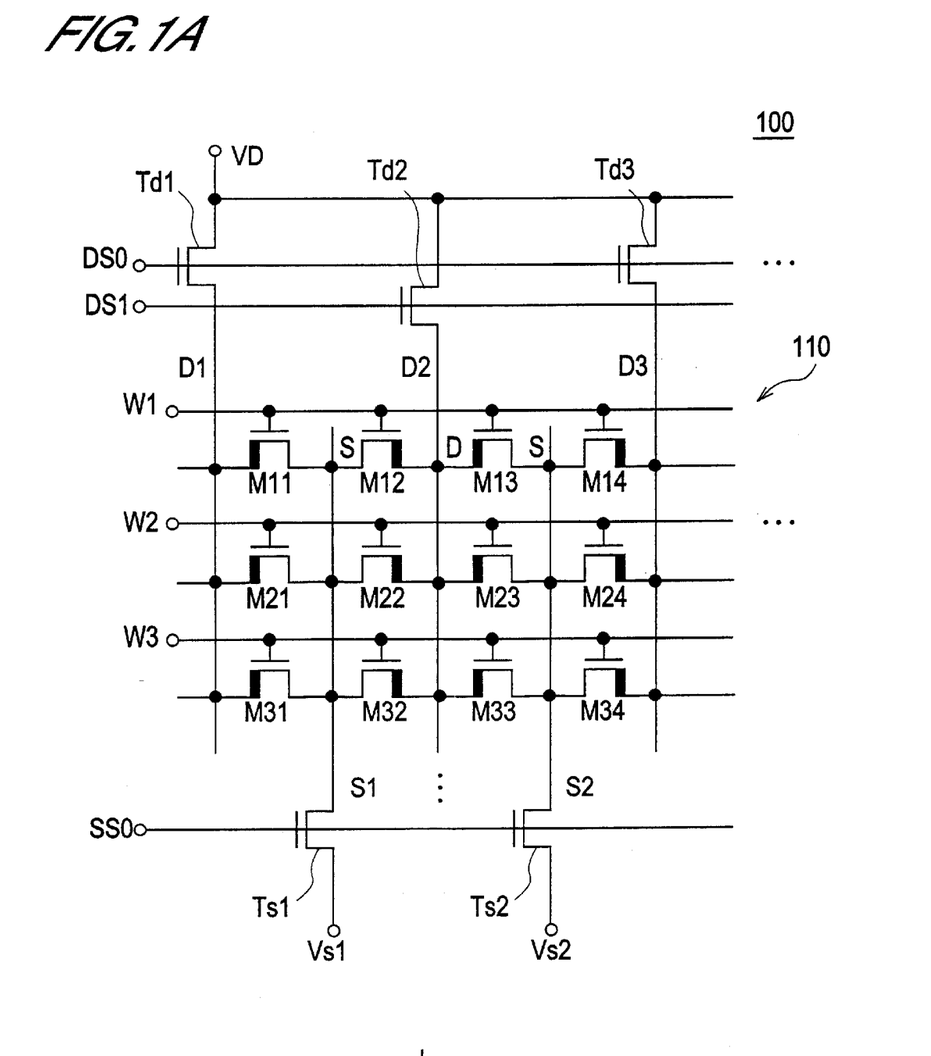
FIGS. 1A and 1C are circuit diagrams illustrating the structure of the read-only nonvolatile memory pertaining to a first embodiment.
Figure 1B:
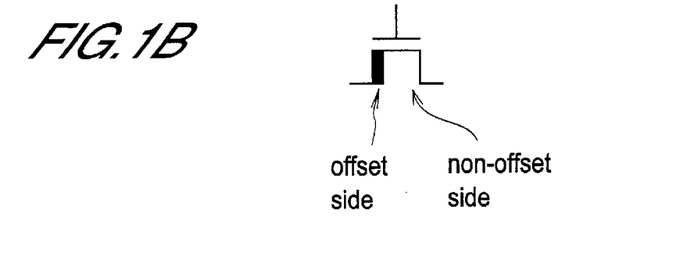
FIG. 1B is a diagram illustrating a transistor signal used in FIG. 1A.

FIG. 1A is a circuit diagram of the mask ROM pertaining to this embodiment, and FIG. 1B is a diagram illustrating the meaning of the transistor signals used in FIG. 1A.

As shown in FIG. 1A, a mask ROM 100 comprises memory cell transistors M11, . . . , Mmn, word lines W1, W2, . . . , drain lines D1, D2, . . . , source lines S1, S2, . . . , drain line selection transistors Td1, Td2, Td3, . . . , drain selection lines DS0 and DS1, a source selection line SS0, and source line selection transistors Ts1, Ts2, . . . .

The memory cell transistors M11, . . . , Mmn are laid out in a matrix, and constitute a memory cell block 110. The memory cell transistors M11, . . . , Mmn have an offset structure formed on just one terminal side, and have a non-offset structure formed on the other terminal side. As shown in FIG. 1B, with each of the memory cell transistors M11, . . . , Mmn, the terminal drawn with a thick line indicates the side on which the offset structure is formed, while the terminal drawn with a thin line indicates the side on which the non-offset structure is formed. With each of the memory cell transistors M11, . . . , Mmn, the terminal on the offset structure side is connected to the terminal on the offset structure side of the adjacent memory cell transistor, while the terminal on the non-offset structure side is connected to the terminal on the non-offset structure side of the other adjacent memory cell transistor. As will be discussed below, the terminal on the offset structure side is used as a drain terminal, and is therefore connected to a drain line. The terminal on the non-offset structure side is used as a source terminal, and is therefore connected to a source line.

The word lines W1, W2, . . . are provided to every row of the n-channel memory cell transistors M11, . . . , Mmn. The memory cell transistors of the same row are commonly connected to the corresponding word line.

The source line D1 is commonly connected to the offset-side terminals of the first column of memory cell transistors M11, M21, M31, . . . . The drain line D2 is commonly connected to the connection points of the offset-side terminals of the second column of memory cell transistors M12, M22, M32, . . . and to the offset-side terminals of the third column of memory cell transistors M13, M23, M33, . . . . Similarly, the other drain lines D3, . . . are also commonly connected to the connection points of the offset-side terminals of the corresponding two columns.

The source line S1 is commonly connected to the connection points of the non-offset-side terminals of the first column of memory cell transistors M11, M21, M31, . . . and to the non-offset-side terminals of the second column of memory cell transistors M12, M22, M32, . . . . Similarly, the other source lines S2, S3, . . . are also commonly connected to the connection points of the non-offset-side terminals of the corresponding two columns.

The drain line selection transistors Td1, Td2, Td3, . . . are connected at one end to the corresponding source lines, and are connected at the other end to a power supply VD. The gates of the odd-numbered source line selection transistors Td1, Td3, . . . are connected to the drain selection line DS0, while the gates of the even-numbered source line selection transistors Td2, Td4, . . . are connected to the drain selection line DS1.

The source line selection transistors Ts1, Ts2, Ts3, . . . are connected at one end to the corresponding source lines, and are connected at the other end to the corresponding power supplies Vs1, Vs2, . . . , and at the gates to the source selection line SS0.

Figure 2:
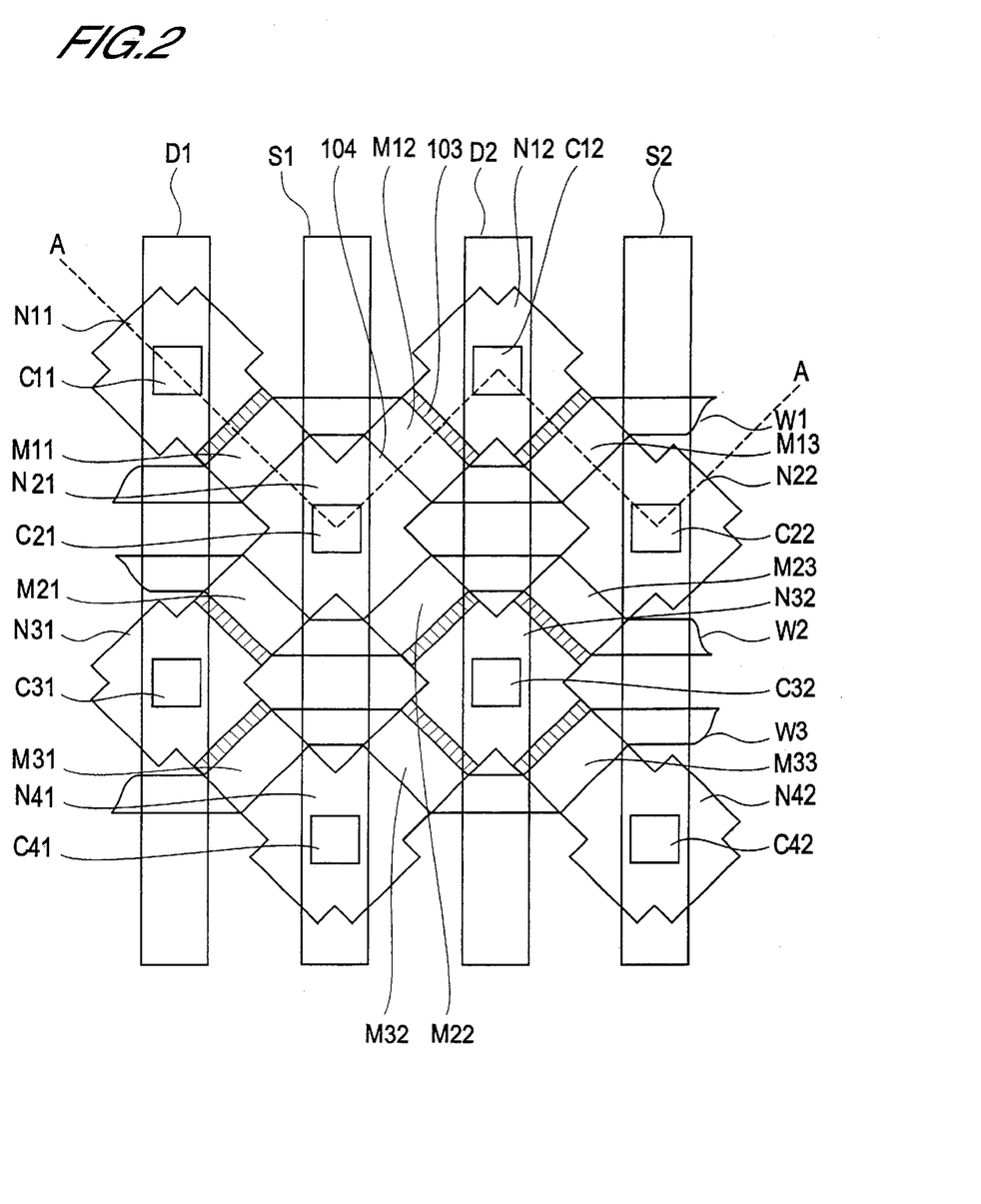
FIG. 2 is a plan view schematically illustrating the structure of the read-only nonvolatile memory pertaining to the first embodiment.
Figure 3:
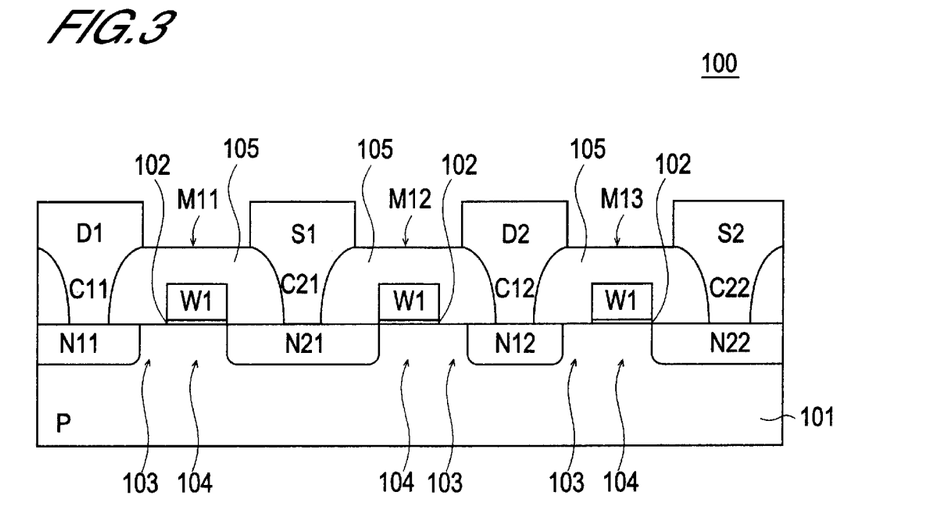
FIG. 3 is a cross section schematically illustrating the structure of the read-only nonvolatile memory pertaining to the first embodiment.

FIG. 2 is a plan view schematically illustrating the structure of the mask ROM 100. FIG. 3 is a cross section along the A—A line in FIG. 2.

n+ diffusion regions N11 to Npq (only N11 to N42 are shown in FIG. 2) are formed on a semiconductor substrate 101. As shown in FIG. 2, these n+ diffusion regions N11 to Npq are laid out in an X shape. These n+ diffusion regions N11 to Npq function as the source or drain of MOS transistors.

Each of the n+ diffusion regions N11 to Npq forms pairs with its four adjacent n+ diffusion regions, constituting the n-channel memory cell transistors M11 to Mmn (only M11 to M33 are shown in FIG. 2). To use the n+ diffusion region N21 in FIG. 2 as an example, it is paired with N11, N12, N31, and N32, constituting four memory cell transistors M11, M12, M21, and M22. Those n+ diffusion regions that are disposed around the periphery of the memory cell block are only next to one or two n+ diffusion regions, and so constitute only one or two MOS transistors.

Word lines W1 to Wm (only W1 to W3 are shown in FIG. 2) are formed on the surface of the semiconductor substrate 101 via a gate insulator film 102. These word lines W1 to Wm function directly as gate electrodes for the various MOS transistors. As discussed above, the n+ diffusion regions N11 to Npq are laid out in an X shape, so the word lines W1 to Wm are formed in an M shape.

In the various memory cell transistors M11 to Mmn, gaps 103 of a specific width are provided between the word lines W1 to Wm and the n+ diffusion regions used as a drain (N11, N12, N31, and N32 in FIG. 2) (see FIG. 3). Meanwhile, the gaps 103 are not provided between the word lines W1 to Wm and the n+ diffusion regions used as a source (N21, N22, N41, and N42 in FIG. 2). Specifically, in this embodiment, the offset structure is provided by providing the gaps 103 of a specific width between the n+ diffusion regions and the word lines, and the non-offset structure is formed by not providing these gaps 103.

When the write data is "1," impurity ions are implanted in the gaps 103 and the semiconductor regions 104 directly beneath the word lines W1 to Wm, but no impurities are implanted when the write data is "0." The operating threshold is low for memory cell transistors in which an impurity has been implanted, while the operating threshold is high for memory cell transistors in which an impurity has not been implanted. Phosphorus ions, arsenic ions, antimony ions, or the like are used as these impurity ions.

An insulating oxide film 105 is formed on the surface of the semiconductor substrate 101. Over the surface of the insulating oxide film 105 are further formed source lines S1, S2, . . . , drain lines D1, D2, . . . , and so forth. The source lines and drain lines are connected to the various corresponding n+ diffusion regions via contact holes C11 to Cmn.

Figure 1C:
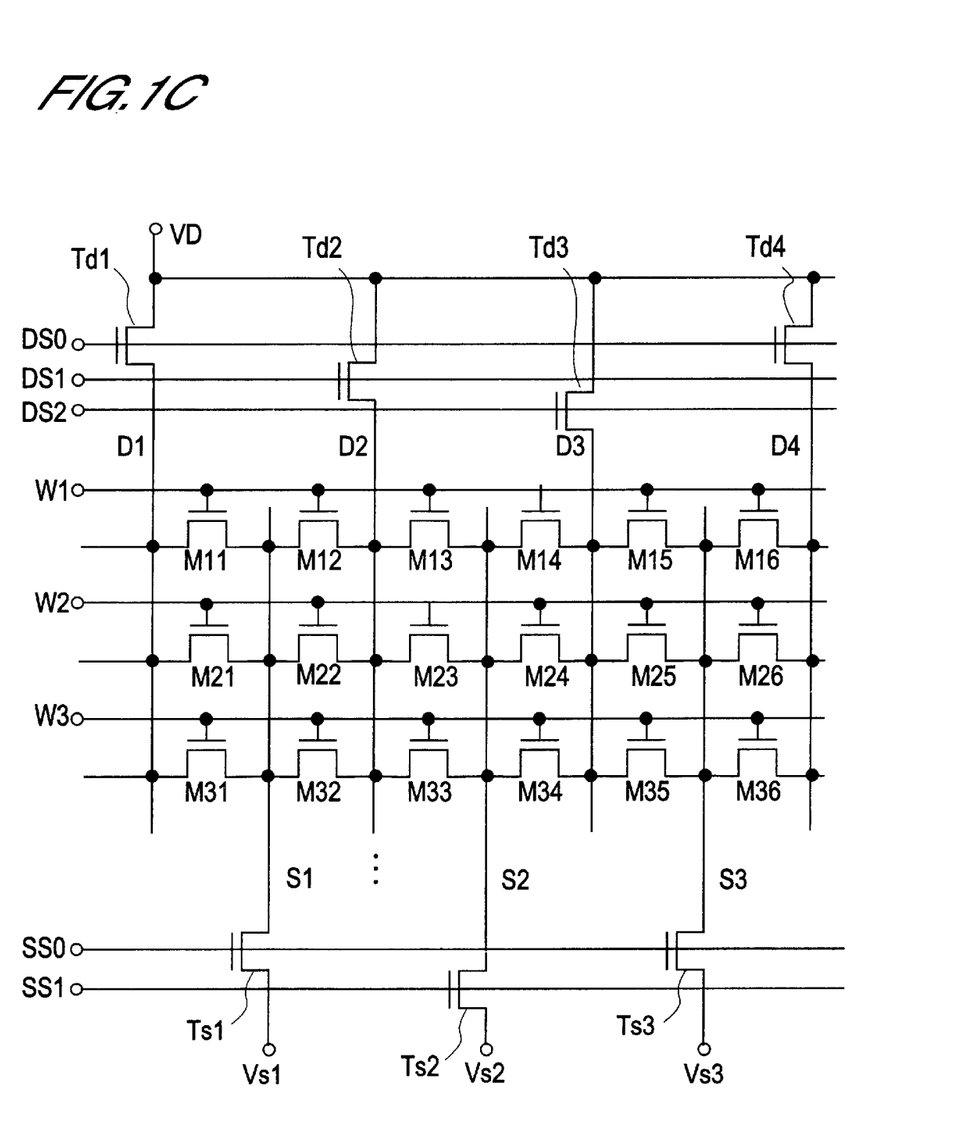

There are only two drain selection lines in FIG. 1A, but it is also possible to have three or more. FIG. 1C is an example of the structure of a mask ROM having three drain selection lines DS0, DS1, and DS2.

The operation of the mask ROM 100 will now be described.

The following description is of an example in which the stored values in the memory cell transistors M11 and M14 are read out. In the following description, the stored value in the memory cell transistor M11 is "0" and the stored values in the memory cell transistors M12, M13, and M14 are "1."

When the stored data is read from the memory cell transistors M11 and M14, the word line W1 and the drain selection line DS0 are activated, and the source selection line SS0 is activated.

Activating the drain selection line DS0 switches on the odd-numbered drain selection transistors Td1, Td3, . . . , and the odd-numbered drain lines D1, D3, . . . are therefore activated. As a result, drain voltage is applied to the memory cell transistors connected to these odd-numbered drain lines D1, D3, . . . (in FIG. 1, the first column of memory cell transistors M11, M21, and M31, and the fourth column of memory cell transistors M14, M24, and M34).

Activating the source selection line SS0 switches on the source selection transistors Ts1, Ts2, . . . , and therefore a low source voltage is applied to all of the source lines S1, S2, . . . .

Furthermore, activating the word line W1 causes gate voltage to be supplied to the first row of memory cell transistors M11, M12, M13, M14, . . . .

Thus, the memory cell transistors M11 and M14 are selected when the word line W1, the drain selection line DS0, and the source selection line SS0 are activated. Specifically, the required gate voltage, drain voltage, and source voltage are applied to the memory cell transistors M11 and M14.

Here, the stored value in the memory cell transistor M11 is "0." Specifically, the operating threshold Vt of the memory cell transistor M11 is high. Accordingly, this memory cell transistor M11 does not conduct power even when the specified gate voltage, drain voltage, and source voltage are applied, and therefore no drain current flows.

The stored value in the memory cell transistor M14 is "1." Therefore, the operating threshold Vt of the memory cell transistor M14 is low. In this case, when the specified gate voltage and drain voltage are applied, the depletion layer near the drain exceeds the offset portion and expands from directly beneath the drain to the channel. Meanwhile, only a low voltage is applied to the source, but because of the non-offset structure, the depletion layer directly beneath the source reaches the channel. Accordingly, the memory cell transistor M14 is in a state in which current flows between the source and drain, that is, a conductive state.

Meanwhile, the specified gate voltage and source voltage are applied to the memory cell transistors M12 and M13, but the drain is in a state of high impedance. In this case, the depletion layer near the drain cannot exceed the offset portion and reach the channel. Accordingly, the memory cell transistors M12 and M13 are in a state in which no current at all flows between the source and drain. This prevents part of the current flowing out from the memory cell transistor M14 flow to the source line S1 as leakage current of the memory cell transistors M12 and M13.

As described above, an offset structure (namely, the gap 103 portion) is provided to the memory cell transistors in this embodiment, so the depletion layer directly under the drain expands to the channel when drain voltage is applied, but the depletion layer directly under the drain does not reach the channel when the drain is in a state of high impedance. Specifically, in this embodiment, the width of the gaps 103 is set so as to obtain this behavior of the depletion layer.

In order to facilitate an understanding of this embodiment, we will now describe a read operation for when the memory cell transistors M11 to Mmn do not have an offset structure on the drain side, that is, in the case of ordinary MOS transistors.

When the stored value in the memory cell transistor M11 is "0" and the stored value in the memory cell transistors M12, M13, and M14 is "1," there is a decrease in the read margin for the following reason.

With an ordinary MOS transistor, the operating characteristics are the same when the source and drain are reversed. Therefore, if the source potential is higher than the drain potential, current will flow from the source side to the drain side. If the stored value is "1," that is, if the operating threshold Vt is low, leakage current will occur at even a slight potential difference.

As discussed above, when the operation of reading "0" from the memory cell transistor M11 and the operation of reading "1" from the memory cell transistor M14 are performed at the same time, there is no flow of current from the memory cell transistor M11 to the source line S1, but current does flow from the memory cell transistor M14 to the source line S2. Accordingly, the potential of the source line S2 becomes slightly higher than the potential of the source line S1. Therefore, when the stored value in the memory cell transistors M12 and M13 is "1," part of the current flowing to the source line S2 flows into the source line S1 as leakage current of the memory cell transistors M12 and M13.

When the stored values in the memory cell transistors M11, M12, and M13 are "0," "1," and "0," respectively, there is a substantial decrease in the read operation speed for the following reason.

When the stored value in the memory cell transistor M12 is "1" and the stored value in the memory cell transistor M13 is "0," the memory cell transistor M12 is prone to the flow of leakage current, while leakage current is less apt to flow with the memory cell transistor M13. Therefore, when a charge accumulates in the parasitic capacitance of the drain line D2, all of the accumulated charge flows into the source line S1. The accumulated charge of parasitic capacitance can be eliminated by performing a discharge treatment prior to the read operation. When a discharge treatment is performed, though, there is a drop in the read access speed. This problem is more pronounced the more unselected memory cell transistors there are between two selected memory cell transistors. For instance, with a mask ROM having three drain selection lines DS0, DS1, and DS2 and two source selection lines SS0 and SS1 as shown in FIG. 1C, the memory cell transistors M11, M15, and M16, for instance, are selected at the same time. In this case, if the stored value in these memory cell transistors M11 and M16 is "0" and the stored value in the memory cell transistors M12, M13, and M14 is "1," then the parasitic capacitance of the drain lines D2 and D3 and the source line S2 will have an adverse effect on the source line S1.

In contrast, with the mask ROM 100 pertaining to this embodiment, the unselected memory cell transistors are completely off. Therefore, current from one selected source line will not flow into another selected source line through an unselected memory cell transistor. This prevents a decrease in the read margin.

Also, because of the unselected memory cell transistors are completely off, a charge accumulated in the parasitic capacitance of an unselected source line or unselected source line will not flow into a selected source line. Consequently, there is no need to remove the charge accumulated in the parasitic capacitance by discharge in advance when reading out the stored values of the selected memory cell transistors, so the reading speed can be raised.

Second Embodiment

A mask ROM will be used as an example for the read-only nonvolatile memory pertaining to the second embodiment, which will be described through reference to FIG. 4.

The circuit configuration of the mask ROM 400 pertaining to this embodiment is the same as in the first embodiment (see FIGS. 1A and 1C). The planar structure of the mask ROM 400 is also substantially the same as in the first embodiment (see FIG. 2).

The mask ROM 400 pertaining to this embodiment differs from the first embodiment given above in that the non-offset structure/offset structure is formed according to whether or not there is an LDD (Lightly Doped Drain) structure.

Figure 4:
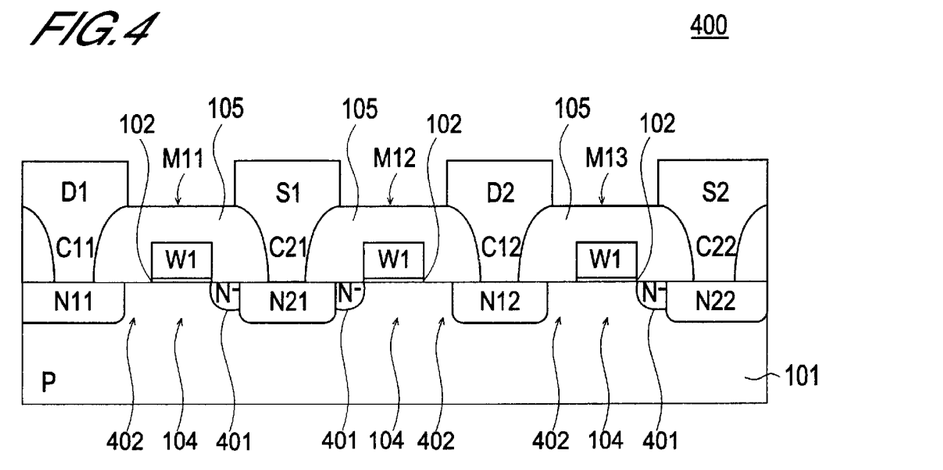
FIG. 4 is a cross section schematically illustrating the structure of the read-only nonvolatile memory pertaining to a second embodiment.

FIG. 4 is a cross section schematically illustrating the structure of the mask ROM 400 pertaining to this embodiment, and corresponds to the A—A cross section in FIG. 2.

In the various memory cell transistors M11 to Mmn, gaps of a specific width are formed between the word lines W1 to Wm and the n+ diffusion regions used as a source (N21, N22, N41, and N42 in FIG. 2), and between the word lines W1 to Wm and the n+ diffusion regions used as a drain (N11, N12, N31, and N32 in FIG. 2). An LDD 401 is formed in each of the gaps on the source side, while nothing is formed in the gaps 402 on the drain side. Specifically, with this embodiment, the offset structure is provided by not providing the LDDs 401 in the gaps between the n+ diffusion regions N11 to Npq and the word lines W1 to Wm, and the non-offset structure is formed by providing the LDDs 401 in these gaps.

When the write data is "1," the same impurity ions as in the first embodiment are implanted in the gaps 402 and the semiconductor regions 104 directly beneath the word lines W1 to Wm, but no impurities are implanted when the write data is "0." The operating threshold is low for memory cell transistors in which an impurity has been implanted, while the operating threshold is high for memory cell transistors in which an impurity has not been implanted.

An insulating oxide film 105 is formed on the surface of the semiconductor substrate 101. Over the surface of the insulating oxide film 105 are further formed source lines S1, S2, . . . , drain lines D1, D2, . . . , and so forth, which are connected to the various corresponding n+ diffusion regions via contact holes C11 to Cmn.

The operation of the mask ROM 400 will now be described.

The following description is of an example in which the stored values in the memory cell transistors M11 and M14 are read out. In the following description, the stored value in the memory cell transistor M11 is "0" and the stored values in the memory cell transistors M12, M13, and M14 are "1."

Just as in the first embodiment, the memory cell transistors M11 and M14 are selected when the word line W1, the drain selection line DS0, and the source selection line SS0 are activated. The required gate voltage, drain voltage, and source voltage are applied to the selected memory cell transistors M11 and M14.

Here, the stored value in the memory cell transistor M11 is "0," so the operating threshold Vt is high. Accordingly, this memory cell transistor M11 is not switched on even when the specified gate voltage, drain voltage, and source voltage are applied, and therefore no drain current flows.

The stored value in the memory cell transistor M14 is "1," so the operating threshold Vt is low. In this case, when the specified gate voltage and drain voltage are applied, the depletion layer near the drain exceeds the offset portion (gaps 402) and expands from directly beneath the drain to the channel. Meanwhile, only a low voltage is applied to the source, but because of the non-offset structure (that is, because the LDDs 401 are formed), the depletion layer directly beneath the source reaches the channel. Accordingly, the memory cell transistor M14 is in a state in which current flows between the source and drain, that is, a conductive state.

Meanwhile, the memory cell transistors M12 and M13 also have a stored value of "1," so the operating threshold Vt is low. With the memory cell transistors M12 and M13, though, the specified gate voltage and source voltage are applied, but the drain is in a state of high impedance. In this case, the depletion layer near the drain cannot exceed the offset portion and reach the channel. Accordingly, the memory cell transistors M12 and M13 are in a state in which no current flows between the source and drain, that is, a non-conductive state.

Thus, since an offset structure (namely, the gaps 402) is provided to the memory cell transistors again with this embodiment, just as with the first embodiment, the depletion layer directly under the drain expands to the channel when drain voltage is applied, but the depletion layer directly under the drain does not reach the channel when the drain is in a state of high impedance.

With the mask ROM 400 pertaining to this embodiment, the unselected memory cell transistors can be switched completely off, just as with the first embodiment, and therefore the read margin can be increased.

In addition, with the mask ROM 400 pertaining to this embodiment, just as with the first embodiment, there is no need to remove the charge accumulated in the parasitic capacitance by discharge, so the reading speed can be raised.

Third Embodiment

A mask ROM will be used as an example for the read-only nonvolatile memory pertaining to the third embodiment, which will be described through reference to FIG. 5.

The circuit configuration of the mask ROM 500 pertaining to this embodiment is the same as in the first embodiment (see FIGS. 1A and 1C). The planar structure of the mask ROM 500 is also substantially the same as in the first embodiment (see FIG. 2).

The mask ROM 500 pertaining to this embodiment differs from the first embodiment given above in that the offset structure/non-offset structure is formed according to whether or not there is a trench.

Figure 5:
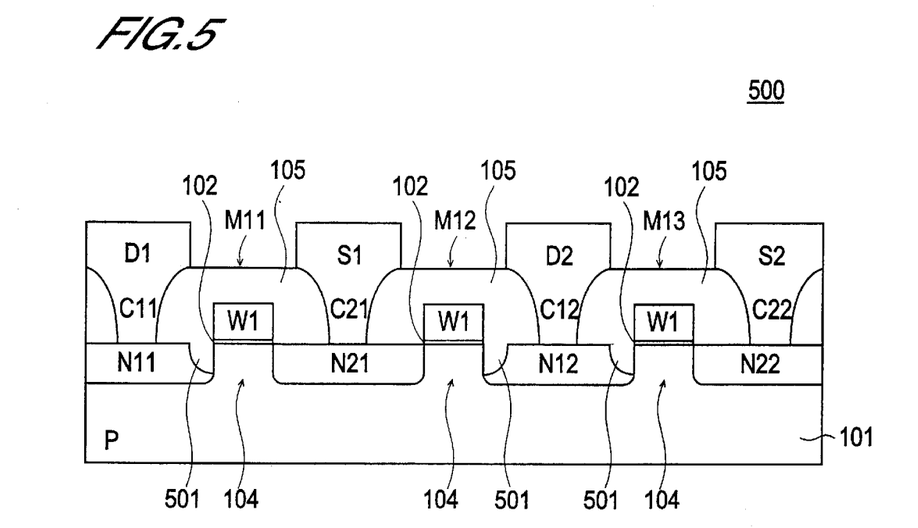
FIG. 5 is a cross section schematically illustrating the structure of the read-only nonvolatile memory pertaining to a third embodiment.

FIG. 5 is a cross section schematically illustrating the structure of the mask ROM 500 pertaining to this embodiment, and corresponds to the A—A cross section in FIG. 2.

In the various memory cell transistors M11 to Mmn, trenches 501 are formed in the n+ diffusion regions used as a drain (see N11, N12, N31, and N32 in FIG. 2) on the side facing the word lines W1 to Wm. No trenches are formed in the n+ diffusion regions used as a source (see N21, N22, N41, and N42 in FIG. 2). Specifically, with this embodiment, the offset structure is formed by providing the trenches 501, and the non-offset structure is formed by not providing these trenches. No gaps are formed between the word lines and the n+ diffusion region used as a source, or between the word lines and the n+ diffusion region used as a drain.

When the write data is "1," the same impurity ions as in the first embodiment are implanted in the semiconductor regions 104 directly beneath the word lines W1 to Wm, but no impurities are implanted when the write data is "0." The operating threshold is low for memory cell transistors in which an impurity has been implanted, while the operating threshold is high for memory cell transistors in which an impurity has not been implanted.

An insulating oxide film 105 is formed on the surface of the semiconductor substrate 101. Over the surface of the insulating oxide film 105 are further formed source lines S1, S2, . . . , drain lines D1, D2, . . . , and so forth, which are connected to the various corresponding n+ diffusion regions via contact holes C11 to Cmn.

The operation of the mask ROM 500 will now be described.

The following description is of an example in which the stored values in the memory cell transistors M11 and M14 are read out. In the following description, the stored value in the memory cell transistor M11 is "0" and the stored values in the memory cell transistors M12, M13, and M14 are "1."

Just as in the first embodiment, the memory cell transistors M11 and M14 are selected when the word line W1, the drain selection line DS0, and the source selection line SS0 are activated. The required gate voltage, drain voltage, and source voltage are applied to the selected memory cell transistors M11 and M14.

Here, the stored value in the memory cell transistor M11 is "0," so the operating threshold Vt is high. Accordingly, this memory cell transistor M11 is not switched on even when the specified gate voltage, drain voltage, and source voltage are applied, and therefore no drain current flows.

The stored value in the memory cell transistor M14 is "1," so the operating threshold Vt is low. In this case, when the specified gate voltage and drain voltage are applied, the depletion layer near the drain exceeds the offset portion (trenches 501) and expands from directly beneath the drain to the channel. Meanwhile, only a low voltage is applied to the source, but because of the non-offset structure (that is, because the trenches 501 are not formed), the depletion layer directly beneath the source reaches the channel. Accordingly, the memory cell transistor M14 is in a state in which current flows between the source and drain, that is, a conductive state.

Meanwhile, the memory cell transistors M12 and M13 also have a stored value of "1," so the operating threshold Vt is low. With the memory cell transistors M12 and M13, though, the specified gate voltage and source voltage are applied, but the drain is in a state of high impedance. In this case, the depletion layer near the drain cannot exceed the offset portion and reach the channel. Accordingly, the memory cell transistors M12 and M13 are in a state in which no current flows between the source and drain, that is, a non-conductive state.

Thus, since an offset structure (namely, the trenches 501) is provided to the memory cell transistors again with this embodiment, just as with the first embodiment, the depletion layer directly under the drain expands to the channel when drain voltage is applied, but the depletion layer directly under the drain does not reach the channel when the drain is in a state of high impedance.

With the mask ROM 500 pertaining to this embodiment, the unselected memory cell transistors can be switched completely off, just as with the first and second embodiments, and therefore the read margin can be increased.

In addition, with the mask ROM 400 pertaining to this embodiment, just as with the first and second embodiments, there is no need to remove the charge accumulated in the parasitic capacitance by discharge, so the reading speed can be raised.

Fourth Embodiment

A mask ROM will be used as an example for the read-only nonvolatile memory pertaining to the fourth embodiment, which will be described through reference to FIG. 6.

The circuit configuration of the mask ROM 600 pertaining to this embodiment is the same as in the first embodiment (see FIGS. 1A and 1C). The planar structure of the mask ROM 600 is also substantially the same as in the first embodiment (see FIG. 2).

The mask ROM 600 pertaining to this embodiment differs from the first embodiment given above in that the offset structure/non-offset structure is formed according to whether or not there is a p+ impurity implantation region.

Figure 6:
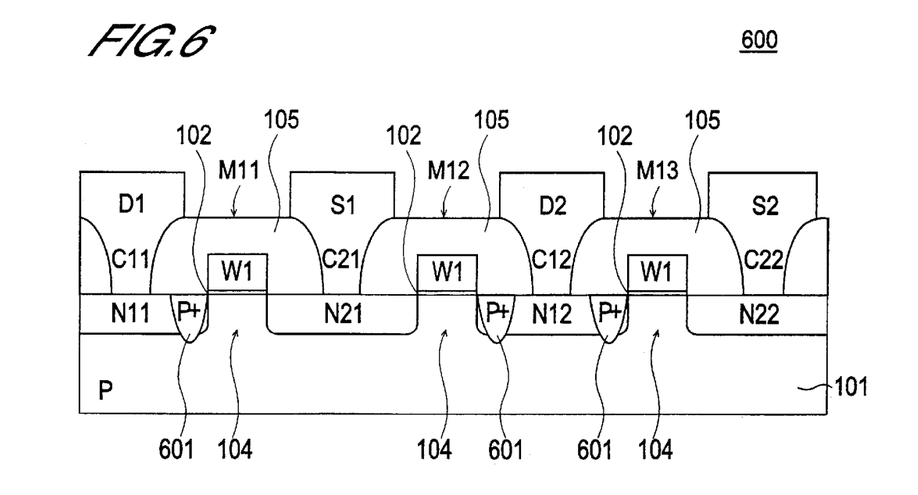
FIG. 6 is a cross section schematically illustrating the structure of the read-only nonvolatile memory pertaining to a fourth embodiment.

FIG. 6 is a cross section schematically illustrating the structure of the mask ROM 600 pertaining to this embodiment, and corresponds to the A—A cross section in FIG. 2.

In the various memory cell transistors M11 to Mmn, p+ impurity implantation regions 601 are formed in the n+ diffusion regions used as a drain (see N11, N12, N31, and N32 in FIG. 2) on the side facing the word lines W1 to Wm. No p+ impurity implantation regions are formed in the n+ diffusion regions used as a source (see N21, N22, N41, and N42 in FIG. 2). Specifically, with this embodiment, the offset structure is formed by providing the p+ impurity implantation regions 601, and the non-offset structure is formed by not providing these p+ impurity implantation regions. No gaps are formed between the word lines and the n+ diffusion region used as a source, or between the word lines and the n+ diffusion region used as a drain.

When the write data is "1," the same impurity ions as in the first embodiment are implanted in the semiconductor regions 104 directly beneath the word lines W1 to Wm, but no impurities are implanted when the write data is "0." The operating threshold is low for memory cell transistors in which an impurity has been implanted, while the operating threshold is high for memory cell transistors in which an impurity has not been implanted.

An insulating oxide film 105 is formed on the surface of the semiconductor substrate 101. Over the surface of the insulating oxide film 105 are further formed source lines S1, S2, . . . , drain lines D1, D2, . . . , and so forth, which are connected to the various corresponding n+ diffusion regions via contact holes C11 to Cmn.

The operation of the mask ROM 600 will now be described.

The following description is of an example in which the stored values in the memory cell transistors M11 and M14 are read out. In the following description, the stored value in the memory cell transistor M11 is "0" and the stored values in the memory cell transistors M12, M13, and M14 are "1."

Just as in the first embodiment, the memory cell transistors M11 and M14 are selected when the word line W1, the drain selection line DS0, and the source selection line SS0 are activated. The required gate voltage, drain voltage, and source voltage are applied to the selected memory cell transistors M11 and M14.

Here, the stored value in the memory cell transistor M11 is "0," so the operating threshold Vt is high. Accordingly, this memory cell transistor M11 is not switched on even when the specified gate voltage, drain voltage, and source voltage are applied, and therefore no drain current flows.

The stored value in the memory cell transistor M14 is "1," so the operating threshold Vt is low. In this case, when the specified gate voltage and drain voltage are applied, the depletion layer near the drain exceeds the offset portion (p+ impurity implantation regions 601) and expands from directly beneath the drain to the channel. Meanwhile, only a low voltage is applied to the source, but because of the non-offset structure (that is, because the p+ impurity implantation regions 601 are not formed), the depletion layer directly beneath the source reaches the channel. Accordingly, the memory cell transistor M14 is in a state in which current flows between the source and drain, that is, a conductive state.

Meanwhile, the memory cell transistors M12 and M13 also have a stored value of "1," so the operating threshold Vt is low. With the memory cell transistors M12 and M13, though, the specified gate voltage and source voltage are applied, but the drain is in a state of high impedance. In this case, the depletion layer near the drain cannot exceed the offset portion and reach the channel. Accordingly, the memory cell transistors M12 and M13 are in a state in which no current flows between the source and drain, that is, a non-conductive state.

Thus, since an offset structure (namely, the p+ impurity implantation regions 601) is provided to the memory cell transistors again with this embodiment, just as with the first embodiment, the depletion layer directly under the drain expands to the channel when drain voltage is applied, but the depletion layer directly under the drain does not reach the channel when the drain is in a state of high impedance.

With the mask ROM 600 pertaining to this embodiment, the unselected memory cell transistors can be switched completely off, just as with the first to third embodiments, and therefore the read margin can be increased.

In addition, with the mask ROM 600 pertaining to this embodiment, just as with the first to third embodiments, there is no need to remove the charge accumulated in the parasitic capacitance by discharge, so the reading speed can be raised.

Fifth Embodiment

A mask ROM will be used as an example for the read-only nonvolatile memory pertaining to the fifth embodiment, which will be described through reference to FIG. 7.

The circuit configuration of the mask ROM 700 pertaining to this embodiment is the same as in the first embodiment (see FIGS. 1A and 1C). The planar structure of the mask ROM 700 is also substantially the same as in the first embodiment (see FIG. 2).

The mask ROM 700 pertaining to this embodiment differs from the first embodiment given above in that the offset structure/non-offset structure is formed by providing a high resistance region. This high resistance region is formed when data is written.

Figure 7:
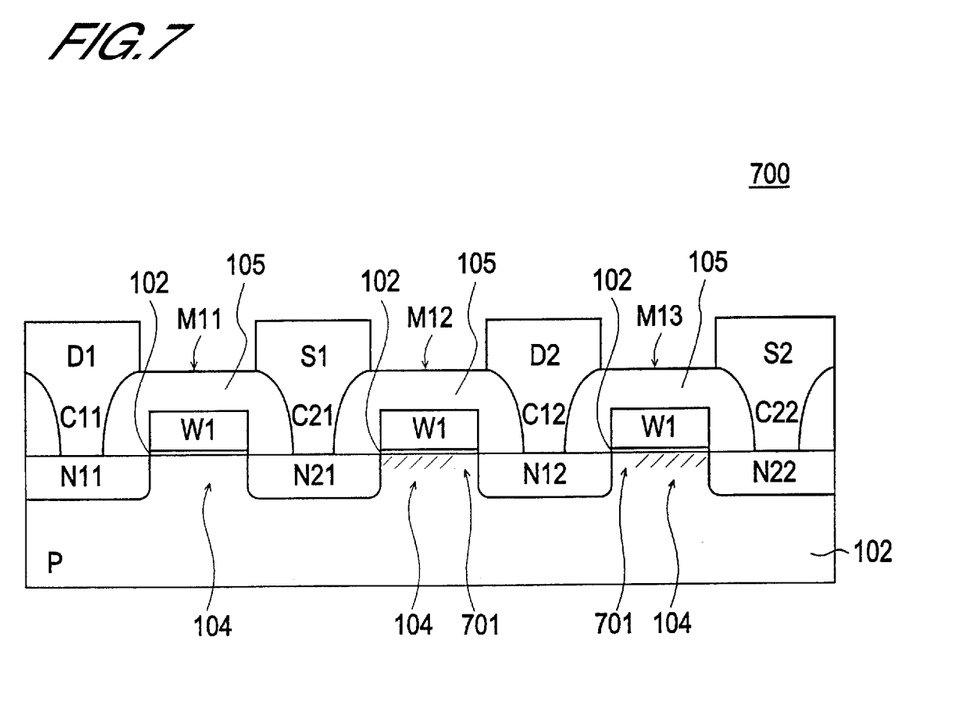
FIG. 7 is a cross section schematically illustrating the structure of the read-only nonvolatile memory pertaining to a fifth embodiment.

FIG. 7 is a cross section schematically illustrating the structure of the mask ROM 700 pertaining to this embodiment, and corresponds to the A—A cross section in FIG. 2.

Just as in the first to fourth embodiments, impurity ions are implanted in the semiconductor regions 104 directly beneath the word lines W1 to Wm when the write data is "1." With this embodiment, in the implantation of an impurity to the regions 104, no impurity is implanted in a region of a specific width near the drain. As a result, high resistance regions 701 are formed near the drain. Meanwhile, an impurity is implanted in the region near the source, and therefore no high resistance region is formed. Specifically, with this embodiment, the offset structure is formed by providing the high resistance regions 701, and the non-offset structure is formed by not providing these high resistance regions.

Just as in the first to fourth embodiments, no impurity is implanted when the write data is "0." Therefore, resistance is high in all of the semiconductor regions 104.

An insulating oxide film 105 is formed on the surface of the semiconductor substrate 101. Over the surface of the insulating oxide film 105 are further formed source lines S1, S2, . . . , drain lines D1, D2, . . . , and so forth, which are connected to the various corresponding n+ diffusion regions via contact holes C11 to Cmn.

The operation of the mask ROM 700 will now be described.

The following description is of an example in which the stored values in the memory cell transistors M11 and M14 are read out. In the following description, the stored value in the memory cell transistor M11 is "0" and the stored values in the memory cell transistors M12, M13, and M14 are "1."

Just as in the first embodiment, the memory cell transistors M11 and M14 are selected when the word line W1, the drain selection line DS0, and the source selection line SS0 are activated. The required gate voltage, drain voltage, and source voltage are applied to the selected memory cell transistors M11 and M14.

Here, the stored value in the memory cell transistor M11 is "0," so the operating threshold Vt is high. Accordingly, this memory cell transistor M11 is not switched on even when the specified gate voltage, drain voltage, and source voltage are applied, and therefore no drain current flows.

The stored value in the memory cell transistor M14 is "1," so the operating threshold Vt is low. In this case, when the specified gate voltage and drain voltage are applied, the depletion layer near the drain exceeds the offset portion (high resistance regions 701) and expands from directly beneath the drain to the channel. Meanwhile, only a low voltage is applied to the source, but because of the non-offset structure (that is, because the high resistance regions are not formed), the depletion layer directly beneath the source reaches the channel. Accordingly, the memory cell transistor M14 is in a state in which current flows between the source and drain, that is, a conductive state.

Meanwhile, the memory cell transistors M12 and M13 also have a stored value of "1," so the operating threshold Vt is low. With the memory cell transistors M12 and M13, though, the specified gate voltage and source voltage are applied, but the drain is in a state of high impedance. In this case, the depletion layer near the drain cannot exceed the offset portion and reach the channel. Accordingly, the memory cell transistors M12 and M13 are in a state in which no current flows between the source and drain, that is, a non-conductive state.

Thus, since an offset structure (namely, the high resistance regions 701) is provided to the memory cell transistors again with this embodiment, just as with the first embodiment, the depletion layer directly under the drain expands to the channel when drain voltage is applied, but the depletion layer directly under the drain does not reach the channel when the drain is in a state of high impedance.

With the mask ROM 700 pertaining to this embodiment, the unselected memory cell transistors can be switched completely off, just as with the first to fourth embodiments, and therefore the read margin can be increased.

In addition, with the mask ROM 700 pertaining to this embodiment, just as with the first to fourth embodiments, there is no need to remove the charge accumulated in the parasitic capacitance by discharge, so the reading speed can be raised.

The first to fifth embodiments employed examples in which n-channel memory cell transistors were formed on a p-type semiconductor substrate. However, the present invention can also be applied to a read-only nonvolatile memory in which P channel memory cell transistors are formed on an n-type semiconductor substrate. The present invention can further be applied to a case in which P channel memory cell transistors are formed in n wells provided to a p-type semiconductor substrate, or to a case in which n-channel memory cell transistors are formed in p wells provided to an n-type semiconductor substrate.

In addition, ordinary bulk type transistors were used in the first to fifth embodiments, but the present invention can also be applied when SOI (Silicon On Insulator) transistors are employed.

What is claimed is:

1. A read-only nonvolatile memory, comprising:
   a plurality of memory cell transistors, disposed in a matrix, and disposed such that source diffusion regions and drain diffusion regions are respectively opposing to each other within the same row;
   a plurality of row selection lines commonly connected to the gate electrodes of the memory cell transistors belonging to the same row;

a plurality of drain lines each commonly connected to two opposing columns of the drain diffusion regions;

a plurality of source lines each commonly connected to two opposing columns of the source diffusion regions;

an offset structure formed between the gate electrode of each memory cell transistor and each drain diffusion region; and a non-offset structure formed between the gate electrode and the source diffusion region of each memory cell transistor.

2. The read-only nonvolatile memory according to claim 1, wherein the offset structures are formed by forming gaps at specific width between the drain diffusion regions and the gate electrodes, and the non-offset structures are formed by not forming these gaps between the source diffusion regions and the gate electrodes.

3. The read-only nonvolatile memory according to claim 1, wherein the offset structures are formed by not providing LDD regions between the drain diffusion regions and the gate electrodes, and the non-offset structure are formed by providing LDD regions between the source diffusion regions and the gate electrodes.

4. The read-only nonvolatile memory according to claim 1, wherein the offset structures are formed by providing trenches between the drain diffusion regions and the gate electrodes, and the non-offset structures are formed by not providing trenches between the source diffusion regions and the gate electrodes.

5. The read-only nonvolatile memory according to claim 1, wherein the offset structures are formed by diffusing an impurity of the opposite conductivity type in the vicinity of the opposing surfaces between the drain diffusion regions and the gate electrodes, and the non-offset structures are formed by not diffusing an impurity of the opposite conductivity type in the vicinity of the opposing surfaces between the drain diffusion regions and the gate electrodes.

6. The read-only nonvolatile memory according to claim 1, wherein the offset structures are formed by not implanting ions for data writing in the vicinity of the opposing surfaces between the drain diffusion regions and the gate electrodes, and the non-offset structures are formed by implanting ions for data writing in the vicinity of the opposing surfaces between the drain diffusion regions and the gate electrodes.

7. The read-only nonvolatile memory according to claim 1, wherein the opposing source diffusion regions and the opposing drain diffusion regions are integrally formed.

8. The read-only nonvolatile memory according to claim 1, wherein the gate electrodes of the memory cell transistors and the row selection lines are respectively formed integrally.

9. The read-only nonvolatile memory according to claim 1, wherein drain selection transistors are further provided to every drain line, one end of each drain selection transistor is connected to the corresponding drain line, and the other end of each drain selection transistor is connected to a first power supply.

10. The read-only nonvolatile memory according to claim 9, further comprising first drain selection lines commonly connected to the control electrodes of odd-numbered drain selection transistors, and second drain selection lines commonly connected to the control electrodes of even-numbered drain selection transistors.

11. The read-only nonvolatile memory according to claim 9, wherein three or more drain selection lines are further provided, and the control electrodes of the drain selection transistors are commonly connected at equal-number intervals to one of these drain selection lines.

12. The read-only nonvolatile memory according to claim 1, wherein source selection transistors are further provided to every source line, one end of each source selection transistor is connected to the corresponding source line, and the other end of each source selection transistor is connected to a second power supply.

13. The read-only nonvolatile memory according to claim 12, further comprising a source selection line commonly connected to the control electrodes of all of the source selection transistors.

14. The read-only nonvolatile memory according to claim 12, wherein two or more source selection lines are further provided, and the control electrodes of the source selection transistors are commonly connected at equal-number intervals to one of these source selection lines.

15. The read-only nonvolatile memory according to claim 1, wherein binary data is written to the memory cell transistors according to the level of an operating threshold.

16. The read-only nonvolatile memory according to claim 15, wherein the operating threshold of the memory cell transistors is set, at the manufacturing stage, according to whether or not an impurity has been implanted in the regions between the source diffusion regions and the drain diffusion regions.

17. The read-only nonvolatile memory according to claim 1, wherein the memory cell transistors are bulk type transistors.

18. The read-only nonvolatile memory according to claim 1, wherein the memory cell transistors are silicon-on-insulator type transistors.

19. The read-only nonvolatile memory according to claim 1, wherein the source diffusion regions and the drain diffusion regions are laid out in an X shape.

20. The read-only nonvolatile memory according to claim 19, wherein the row selection lines are formed in an M shape.

* * * * *